(12) United States Patent
Murooka

(10) Patent No.: US 8,320,156 B2
(45) Date of Patent: Nov. 27, 2012

(54) SEMICONDUCTOR MEMORY DEVICE

(75) Inventor: Kenichi Murooka, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 302 days.

(21) Appl. No.: 12/695,512

(22) Filed: Jan. 28, 2010

(65) Prior Publication Data

US 2011/0002156 A1 Jan. 6, 2011

(30) Foreign Application Priority Data

Jul. 2, 2009 (JP) .................................. 2009-157504

(51) Int. Cl.
*G11C 11/00* (2006.01)
*G11C 5/14* (2006.01)
(52) U.S. Cl. ........................................ 365/148; 365/226
(58) Field of Classification Search .................... None
See application file for complete search history.

(56) References Cited

U.S. PATENT DOCUMENTS

| | | | |
|---|---|---|---|
| 6,078,641 | A | 6/2000 | Mitsui et al. |
| 6,504,753 | B1 | 1/2003 | Scheuerlein et al. |
| 2007/0165442 | A1* | 7/2007 | Hosoi et al. ............... 365/100 |
| 2010/0128512 | A1* | 5/2010 | Ohnishi et al. ............. 365/145 |

FOREIGN PATENT DOCUMENTS

WO  WO 2009/058482 A1  5/2009

OTHER PUBLICATIONS

Korean Office Action issued Jul. 15, 2011, in Patent Application No. 10-2010-20721 (with English-language translation).
S. Kimura, "Semiconductor Memory: DRAM", Oyo Butsuri, vol. 69, No. 10, Oct. 2000. (p. 1233-1240).
N. Ajika, "Flash Memory, Recent Topics", Oyo Butsuri, vol. 69, No. 12, Dec. 2000. (p. 1462-1466).

* cited by examiner

*Primary Examiner* — Hoai V Ho
*Assistant Examiner* — James G Norman
(74) *Attorney, Agent, or Firm* — Oblon, Spivak, McClelland, Maier & Neustadt, L.L.P.

(57) ABSTRACT

A semiconductor memory device includes a plurality of first wirings; a plurality of second wirings; a plurality of memory cells positioned at respective intersections of the first wirings and the second wirings, each of the memory cells having a variable resistance element and a selective element connected to the variable resistance element in series; a first selection portion selecting the first wiring; a second selection portion selecting the second wiring; and a power source portion applying predetermined selected-wiring-voltages to a selected first wiring being selected by the first selection portion and a selected second wiring being selected by the second selection portion, respectively, and applying predetermined unselected-wiring-voltages to unselected first wirings other than the selected first wiring and unselected second wirings other than the selected second wiring, respectively. A resistance element having a predetermined resistance value is provided between the power source portion and the unselected first and second wirings.

19 Claims, 6 Drawing Sheets

SEMICONDUCTOR MEMORY DEVICE

CROSS-REFERENCE TO RELATED APPLICATIONS

This application is based upon and claims the benefit of priority from the prior Japanese Patent Application No. 2009-157504, filed on Jul. 2, 2009, the entire contents of which are incorporated herein by reference.

BACKGROUND OF THE INVENTION

1. Field of the Invention

The present invention relates to a semiconductor memory device.

2. Description of the Related Art

In recent years, as semiconductor devices have been highly integrated, circuit patterns of LSI devices contained therein have been increasingly made finer. Fine processing of the patterns requires not only thinner line widths simply but also improvements in dimensional accuracy and positional accuracy of patterns. Semiconductor memory devices called memories are not an exception. In memory cells formed with the free use of high-accuracy processing technologies, it has been continuously desired that a certain amount of charge required for storage is held within a narrower region.

Various memories such as DRAMs, SRAMs and flash memories have been produced up to now. These memories all use a MOSFET in a memory cell and accordingly fine processing of patterns causes a need for an improvement in dimensional accuracy at a higher rate than the rate of fine processing. Therefore, the lithography technology of forming these patterns is imposed with larger loads, which become a factor in increasing the lithography process cost that occupies the major part of the current mass production cost, that is, a factor in increasing the product cost (see Shinichiro Kimura, "Semiconductor memory; DRAM", OYO BUTURI, 2000, Vol. 69, No. 10, pp. 1233 to 1240, and Natsuo Ajika, "Flash memory, recent trend", OYO BUTURI, 2000, Vol. 69, No. 12, pp. 1462 to 1466).

As a technique overcoming such problems, a memory called ReRAM which has memory cells configured of selective elements including non-ohmic elements typified by diodes and a resistance changing material has been recently proposed. The ReRAM can be configured without using electric charge storage for holding memory and using no MOSFET for memory cells. The integration higher than the related-art trend is expected.

From the viewpoint of effective utilization of energy resources, the power consumption of semiconductor devices has been required to be minimized. This is not an exception for memories. The proportion of the memory cell array portion occupying the entire memory device is high. Therefore, it is important to reduce the power consumption of the memory cell array (see U.S. Pat. No. 6,504,753). In the ReRAM which uses no MOSFET for memory cells, not only the power consumption of the memory cell corresponding to an actually accessed bit, but also the power consumption of the remaining memory cells, cannot be neglected. The power consumption of the entire memory cell array has been required to be reduced.

SUMMARY OF THE INVENTION

A semiconductor memory device according to an aspect of the present invention includes: a plurality of first wirings arranged in parallel; a plurality of second wirings arranged so as to cross the first wirings; a plurality of memory cells positioned at respective intersections of the first wirings and the second wirings, each of the memory cells having a variable resistance element and a selective element connected to the variable resistance element in series; a first selection portion selecting the first wiring; a second selection portion selecting the second wiring; and a power source portion applying predetermined selected-wiring-voltages to a selected first wiring being selected by the first selection portion and a selected second wiring being selected by the second selection portion, respectively, and applying predetermined unselected-wiring-voltages to unselected first wirings other than the selected first wiring and unselected second wirings other than the selected second wiring, respectively, a resistance element having a predetermined resistance value being provided between the power source portion and the unselected first and second wirings.

A semiconductor memory device according to another aspect of the present invention includes: a plurality of first wirings arranged in parallel; a plurality of second wirings arranged so as to cross the first wirings; a plurality of memory cells positioned at respective intersections of the first wirings and the second wirings, each of the memory cells having a variable resistance element and a selective element connected to the variable resistance element in series; a first selection portion selecting the first wiring; a second selection portion selecting the second wiring; a power source portion applying predetermined selected-wiring-voltages to a selected first wiring being selected by the first selection portion and a selected second wiring being selected by the second selection portion, respectively, and applying predetermined unselected-wiring-voltages to unselected first wirings other than the selected first wiring and unselected second wirings other than the selected second wiring, respectively; a plurality of first resistance elements provided on each of the first wirings and the second wirings in the first selection portion and the second selection portion and connected to the first wirings and the second wirings in the unselected state, each of the first resistance elements having a predetermined resistance value; and a plurality of second resistance elements provided between the power source portion and the first and second selection portions and having a predetermined resistance value.

A semiconductor memory device according to still another aspect of the present invention includes: a plurality of first wirings arranged in parallel; a plurality of second wirings arranged so as to cross the first wirings; a plurality of memory cells positioned at respective intersections of the first wirings and the second wirings, each of the memory cells having a variable resistance element and a selective element connected to the variable resistance element in series; a first selection portion selecting the first wiring; a second selection portion selecting the second wiring; a power source portion applying predetermined selected-wiring-voltages to a selected first wiring being selected by the first selection portion and a selected second wiring being selected by the second selection portion, respectively; a plurality of first resistance elements provided on each of the first wirings and the second wirings in the first selection portion and the second selection portion and connected to the first wirings and the second wirings in the unselected state, each of the first resistance elements having a predetermined resistance value; and a plurality of second resistance elements having a predetermined resistance value and provided between the power source portion and the first and second selection portions, the power source portion applying unselected-wiring-voltages via the first and second resistance elements to the unselected first wirings other than the selected first wiring and the unselected second wirings other than the selected second wiring.

DETAILED DESCRIPTION OF THE EMBODIMENTS

A semiconductor memory device according to an embodiment of the present invention will be described below with reference to the drawings.

Embodiment

Figure 1:
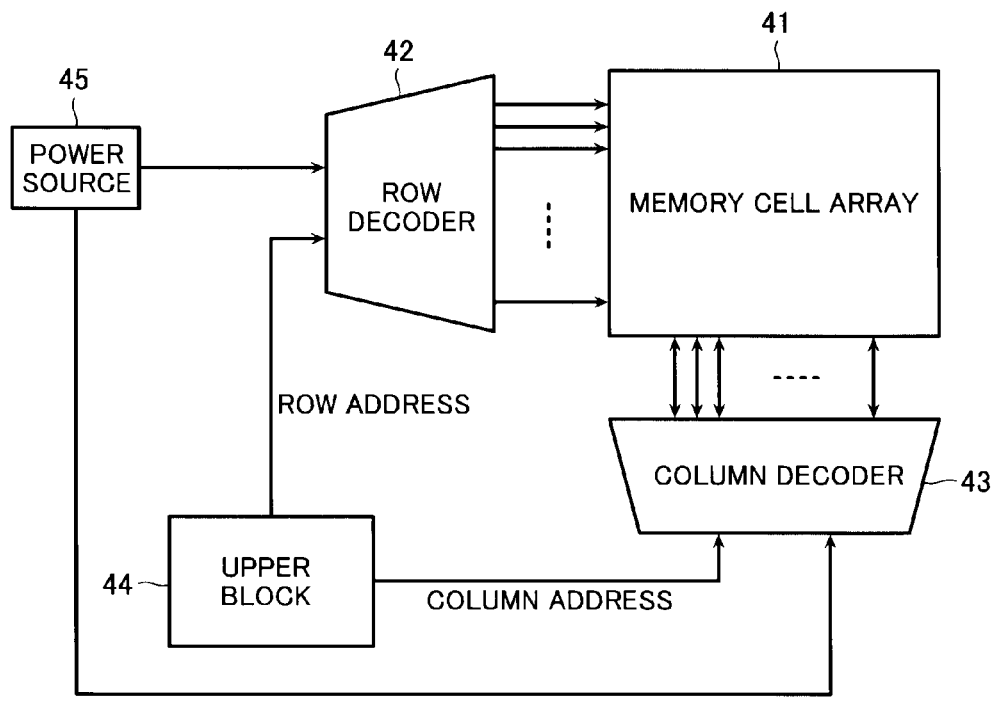
FIG. 1 is a block diagram of a semiconductor memory device according to an embodiment.

The Configuration of a Semiconductor Memory Device According to an Embodiment FIG. 1 is a block diagram of a semiconductor memory device according to an embodiment of the present invention. The semiconductor memory device has a memory cell array 41 having a plurality of row lines (first wirings), a plurality of column lines (second wirings) crossing the row lines, and memory cells positioned at respective intersections thereof. The semiconductor memory device includes a row decoder (a first selection portion) 42 selecting the row line, and a column decoder (a second selection portion) 43 selecting the column line. The semiconductor memory device includes an upper block 44 as read control means which provides a row address and a column address to the row decoder 42 and the column decoder 43, respectively, and selects the memory cell performing read and write in the memory cell array 41. A power source 45 generates a combination of predetermined voltages corresponding to the respective operations of read, write and erase and supplies the voltage to the row decoder 42 and the column decoder 43. In the following description, according to the typical semiconductor memory device, the row line is called a word line and the column line is called a bit line.

Figure 2:
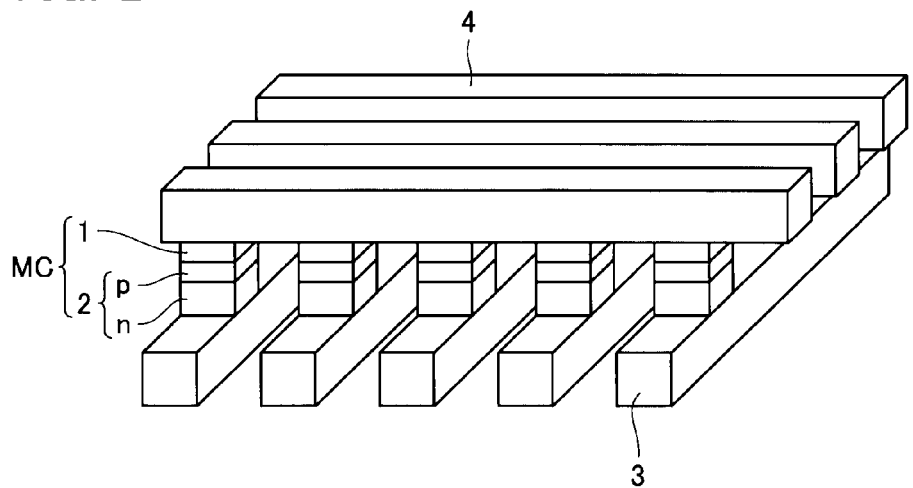
FIG. 2 is a perspective view showing part of a memory cell array of the semiconductor memory device according to the embodiment.

FIG. 2 is a perspective view showing part of the memory cell array 41 shown in FIG. 1. The memory cell array includes a plurality of word lines (first wirings) 3 arranged in parallel, and a plurality of bit lines (second wirings) 4 arranged so as to cross the word lines 3. A memory cell MC having a variable resistance element 1 which is transited between at least two resistance states of the low-resistance state and the high-resistance state and a selective element including a non-ohmic element, e.g., a diode 2, is positioned at respective intersections of the word lines 3 and the bit lines 4. The semiconductor memory device of this embodiment shown in FIG. 2 has a crosspoint configuration.

In this configuration, the word lines 3 and the bit lines 4 have simple line-and-space patterns. Thus, the word lines 3 and the bit lines 4 are sufficient if they have orthogonal positional relations therebetween. Accordingly, it is not required to consider misalignments along the word line 3 and along the bit line 4. Therefore, the production steps can be executed with extremely loose alignment accuracy within the memory cell array, which makes productions easier.

Available examples of the variable resistance element 1 include: one that changes the resistance in accordance with a phase change between the crystalline state and the amorphous state, such as a chalcogenide (PCRAM); one that changes the resistance by precipitating metal cations to form a bridge (conducting bridge) between electrodes and ionizing the precipitated metal to destruct the bridge (CBRAM); and one that changes the resistance by applying a voltage or current (ReRAM) (which is roughly divided into one that causes a variation in resistance in accordance with the presence/absence of charge trapped in charge traps present in the electrode interface, and one that causes a variation in resistance in accordance with the presence/absence of the conduction path due to an oxygen loss and so forth). For the ReRAM, $ZnMn_2O_4$, NiO, $TiO_2$, $SrZrO_3$, and $Pr_{0.7}Ca_{0.3}MnO_3$ can be used.

In this embodiment, the variable resistance element 1 is formed of $ZnMn_2O_4$ having a film thickness of 15 nm, and has one end connected to the bit line 4 made of tungsten (W) via an TaN electrode and the other end connected to the P side of the PN junction diode 2 made of Si via a TiN electrode. The N side of the PN junction diode is connected to the word line 3 made of tungsten (W) via the TiN electrode. The pitch of the word line 3 and the bit line 4 is 44 nm including a line width of 22 nm and a space of 22 nm. The cell portion has a cross section of 22 nm×22 nm.

In the case of unipolar type ReRAM, write of data to the memory cell MC is performed by applying to the variable resistance element 1 a voltage of, for example, 3.5 V (actually about 4.5 V if a voltage drop portion of the diode 2 is included) and a current of about 10 nA for a time of about 10 ns-100 ns. This causes the variable resistance element 1 to change from the high-resistance state to the low-resistance state (set operation).

On the other hand, erase of data in the memory cell MC is performed by applying to the variable resistance element 1 in the low-resistance state subsequent to the setting operation a voltage of 0.8 V (actually about 1.8 V if a voltage drop portion of the diode 2 is included) and a current of about 1 µA-10 µA for a time of about 500 ns-2 µs. This causes the variable resistance element 1 to change from the low-resistance state to the high-resistance state (reset operation).

A read operation of the memory cell MC is performed by applying to the variable resistance element 1 a voltage of 0.4 V (actually about 1.4 V if a voltage drop portion of the diode 2 is included) and monitoring a current flowing via the variable resistance element 1 using a sense amplifier. This allows judgment of whether the variable resistance element 1 is in the high-resistance state or the low-resistance state.

To simply understand the configuration and operation of the semiconductor memory device of this embodiment, the configuration, operation, and problems of a semiconductor memory device of a comparative example will be described here. After that, the configuration and operation of the semiconductor memory device of this embodiment will be described.

Figure 3:
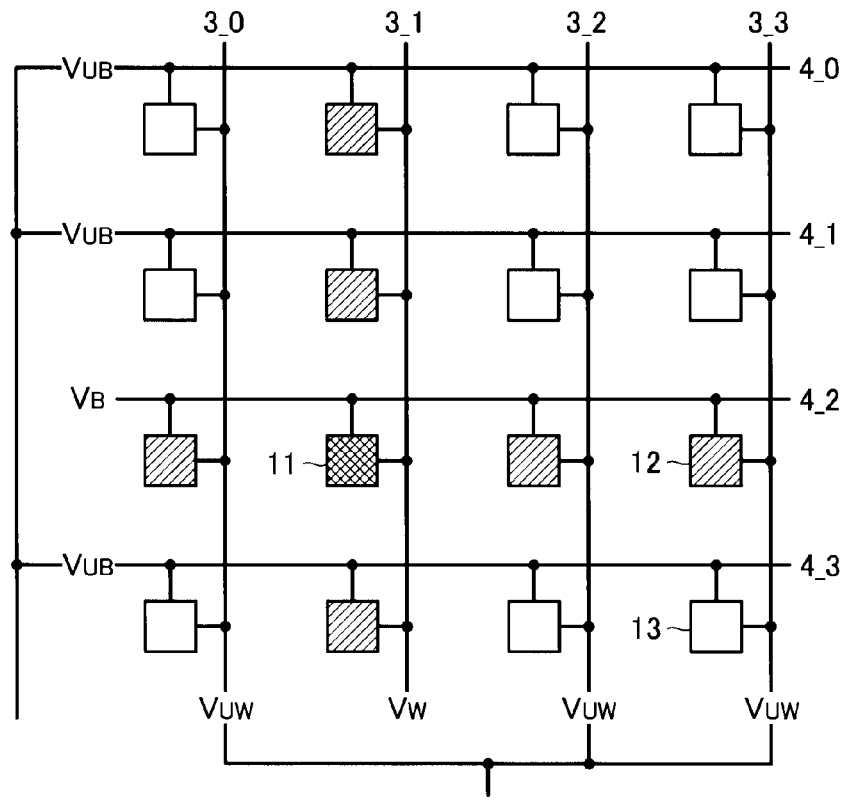
FIG. 3 is a block diagram showing part of a semiconductor memory device of a comparative example.

FIG. 3 is a block diagram of part of the memory cell array of the semiconductor memory device of the comparative example. As in the embodiment, the memory cell array of the comparative example has a crosspoint configuration using the variable resistance element 1 and the diode 2. The variable resistance element 1 includes a thin film made of one of materials such as $ZnMn_2O_4$, NiO, $TiO_2$, $SrZrO_3$, $Pr_{0.7}Ca_{0.3}MnO_3$, and so on.

As shown in FIG. 3, in the operation of the semiconductor memory device, there are three voltage applied states in the memory cells. The voltage applied states of the memory cells will be described below by taking the set operation as an example. In FIG. 3, the selected bit line and the selected word line are a bit line 4_2 and a word line 3_1, to which a selected bit line voltage $V_B$ and a selected word line voltage $V_W$ are applied, respectively. The unselected bit lines and the unselected word lines are bit lines 4_0, 4_1 and 4_3 and word lines 3_0, 3_2 and 3_3, to which an unselected bit line voltage $V_{UB}$ and an unselected word line voltage $V_{UW}$ are applied, respectively.

The memory cell connected to the intersection of the selected bit line 4_2 and the selected word line 3_1 shown in FIG. 3 is in the selected state (forward bias state) and is represented by the crossing pattern symbol shown in the drawing. A set voltage is applied to a selected memory cell 11 in the forward direction of the diode 2 from the selected bit line 4_2 (voltage $V_B$) to the selected word line 3_1 (voltage $V_W$). As a result, the variable resistance element 1 of the selected memory cell 11 is changed from the high-resistance state to the low-resistance state and the set operation is completed.

The memory cells connected to the intersections of the selected bit line 4_2 and the unselected word lines 3_0, 3_2 and 3_3 shown in FIG. 3 are in the semi-selected state (non-bias state) and are represented by the hatching symbols shown in the drawing. The memory cells connected to the intersections of the selected word line 3_1 and the unselected bit lines 4_0, 4_1 and 4_3 are also in the semi-selected state (non-bias state) and are represented by the hatching symbols shown in the drawing. Substantially the same voltage $V_{UW}$ as a voltage applied to the selected bit line 4_2 is applied to the unselected word lines 3_0, 3_2 and 3_3. Substantially the same voltage $V_{UB}$ as a voltage applied to the selected word line 3_1 is applied to the unselected bit lines 4_0, 4_1 and 4_3. There is thus no potential difference between semi-selected memory cells 12, and the electric current does not flow to the semi-selected memory cells 12.

The memory cells connected to the intersections of the unselected word lines 3_0, 3_2 and 3_3 and the unselected bit lines 4_0, 4_1 and 4_3 shown in FIG. 3 are in the unselected state (reverse bias state) and are represented by the hollow symbols shown in the drawing. A voltage is applied to unselected memory cells 13 in the reverse bias direction of the diodes 2 from the unselected word lines 3_0, 3_2 and 3_3 (voltage $V_{UB}$) to the unselected bit lines 4_0, 4_1 and 4_3 (voltage $V_{UW}$). Therefore, the electric current to the extent of interfering with the set operation does not flow to the unselected memory cells 13.

By such a voltage application method, the desired voltage can be applied only to the selected memory cell 11. In the reset and read operations, the same operation as the set operation is performed by changing the values of the voltages applied to the bit lines and the word lines. As shown in FIG. 3, in the comparative example, the unselected bit lines and the unselected word lines are directly connected to the common wirings. Therefore, the voltages of all the unselected bit lines are the same, and so are the voltages of all the unselected word lines.

In the above description, the voltage $V_B$ is set to a predetermined voltage $V_{OP}$ at which the memory cell is operated, the voltage $V_W$ is set to 0 V, the voltage $V_{UB}$ is set to 0 V and the voltage $V_{UW}$ is set to $V_{OP}$ to perform write, erase and read operation of the selected memory cell. In this case, a voltage of $-V_{OP}$ is applied to the unselected memory cells 13, and then a reverse leak current caused by the leak current characteristic of the diodes 2 flows to the unselected memory cells 13. The selected memory cell 11 existing in the memory cell array nothing but only one. However, so many unselected memory cells 13 exist in the memory cell array, for example, there are (m−1)×(n−1) unselected memory cells 13 in the m×n array. When m=n=1024, therefore, about $10^6$ unselected memory cells exist. The reverse leak current of each of the unselected memory cells 13 is small, but cannot be neglected in the entire memory cell array. The proportion of the reverse leak current of the diodes 2 occupying the power consumption of the memory cell array is very high.

To reduce the influence of the reverse leak current, the voltage $V_{UB}$ of the unselected bit lines can be set to $V_{offset}$ and the voltage $V_{UW}$ of the unselected word lines can be set to $V_{OP}-V_{offset}$, wherein the $V_{offset}$ denotes a voltage slightly smaller than the turn-on voltage of the diode 2. The voltage applied to the unselected memory cell 13 thus becomes $2 \times V_{offset} - V_{OP}$.

Figure 4:
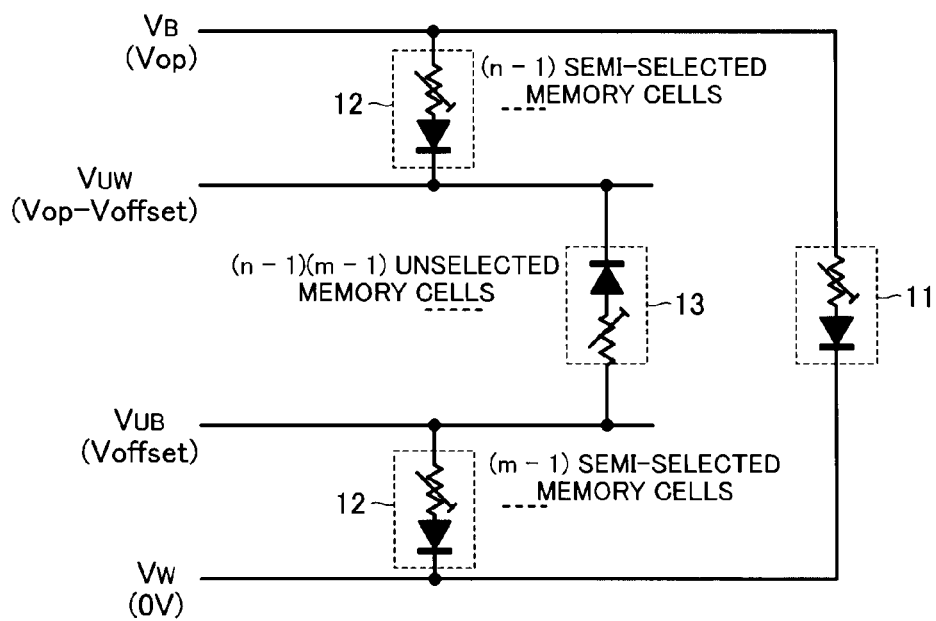
FIG. 4 is a schematic diagram for explaining the operation of the semiconductor memory device of the comparative example.

FIG. 4 is a schematic diagram for explaining the operation of the semiconductor memory device of the comparative example when the voltage $V_{UB}$ of the unselected bit lines is $V_{offset}$ and the voltage $V_{UW}$ of the unselected word lines is $V_{OP}-V_{offset}$. The high and low voltage values of the word lines 3 and the bit lines 4 correspond to the vertical direction in the sheet. The memory cells in the respective states connected to the word lines 3 and the bit lines 4 are shown.

As shown in FIG. 4, the voltage applied to the unselected memory cell 13 is reduced by changing the voltages applied to the unselected bit line and the unselected word line with $V_{offset}$ respectively. As a result, the reverse leak current of the unselected memory cell 13 is decreased, and the power consumption of the semiconductor memory device can be reduced. In such a voltage application method, unless the reverse leak current of the diode is reduced, the useless consumed current is increased. Therefore, the value of the voltage $V_{offset}$ must be determined in consideration of the total leak current reduction effect.

Here, the optimum value of the voltage $V_{offset}$ largely depends on the number of the semi-selected memory cells 12 in the low-resistance state. When the semi-selected memory cells 12 in the memory cell array are in the low-resistance state, the electric current can easily flow via the semi-selected memory cells 12. Even if there are only a few semi-selected memory cells 12 in the low-resistance state, increasing the voltage value of the voltage $V_{offset}$ causes an increase in the electric current flowing via the semi-selected memory cells 12. It is thus difficult to increase the offset amount. The power consumption reduction has a limitation in that it is determined by the resistance state of the semi-selected memory cells 12.

The semiconductor memory device according to the embodiment of the present invention can reduce the power consumption of the entire memory cell array regardless of the resistance state of the semi-selected memory cell 12. The semiconductor memory device of this embodiment will be described.

Figure 5:
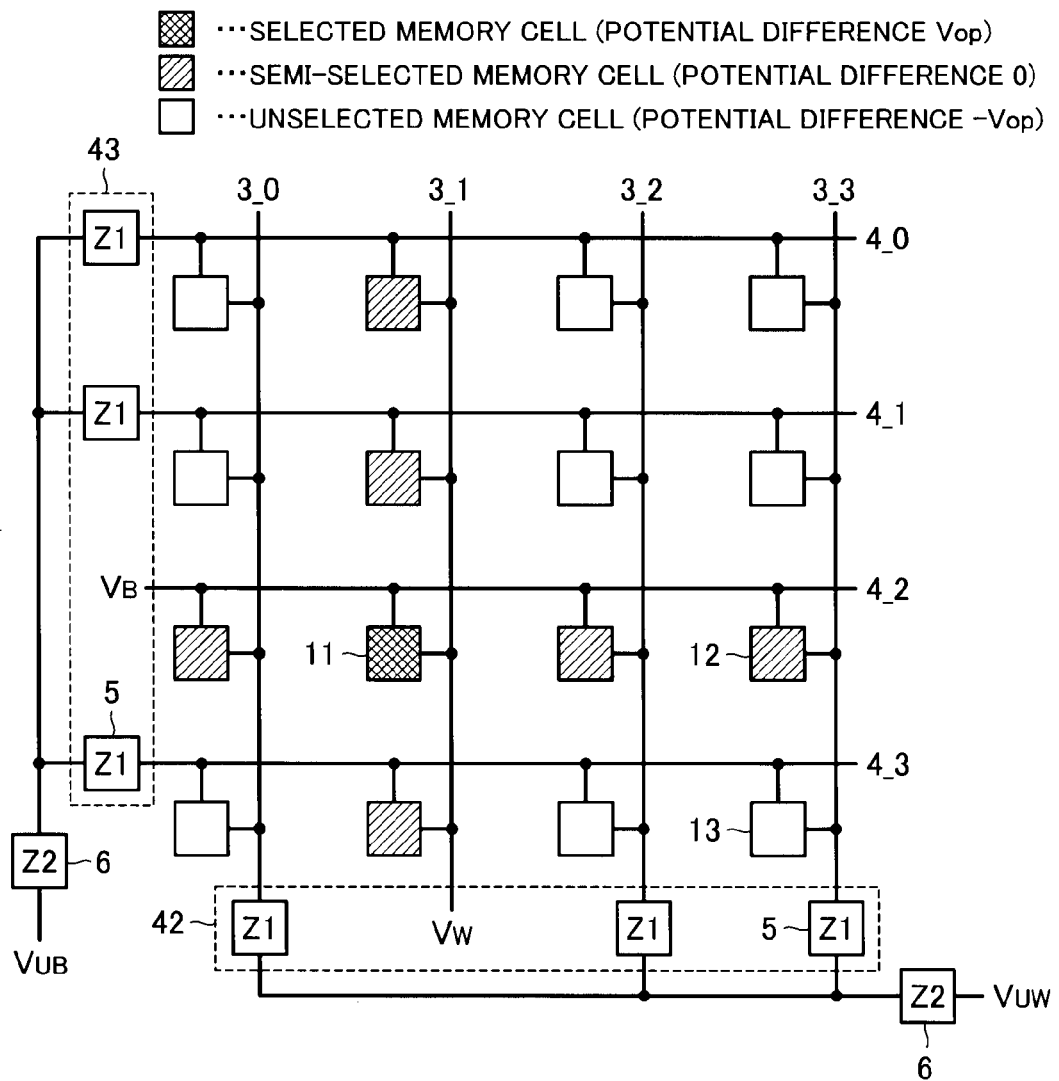
FIG. 5 is a block diagram showing part of the semiconductor memory device according to the embodiment.

FIG. 5 is a block diagram of part of the memory cell array of the semiconductor memory device of this embodiment. In the semiconductor memory device of this embodiment, predetermined unselected line voltages $V_{UW}$ and $V_{UB}$ are supplied to the row decoder 42 and the column decoder 43 from the power source 45 via resistance loads (second resistance elements) $Z_2$6. The unselected line voltages $V_{UW}$ and $V_{UB}$ are supplied to the unselected word lines and the unselected bit lines from the row decoder 42 and the column decoder 43 via resistance loads (first resistance elements) $Z_1$5. This embodiment is different from the comparative example in that the unselected bit lines and the unselected word lines are connected to the power source 45 for the unselected lines via the resistance loads $Z_1$5 and $Z_2$6 each having a predetermined electric resistance component.

In the semiconductor memory device of this embodiment, the power consumption can be reduced more effectively by the existence of the resistance loads $Z_1$5 connected to the unselected lines. Such power consumption reduction effect in the semiconductor memory device will be described below.

Figure 6:
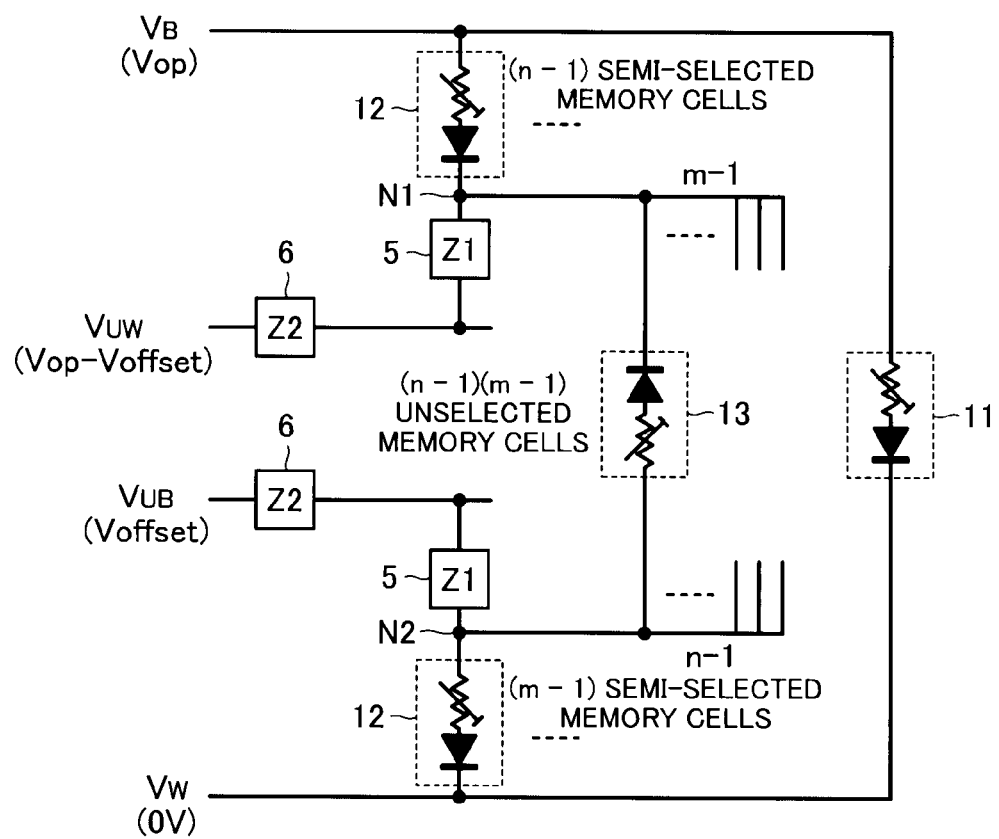
FIG. 6 is a schematic diagram for explaining the operation of the semiconductor memory device according to the embodiment.

FIG. 6 is a schematic diagram for explaining the operation of the semiconductor memory device when voltages are applied to the unselected bit lines and the unselected word lines via the resistance loads $Z_1$5 and $Z_2$6. Like FIG. 4, the high and low voltage values of the word lines 3 and the bit lines 4 correspond to the vertical direction in the sheet. The memory cells in the respective states connected to the word lines 3 and the bit lines 4 are shown.

As shown in FIG. 6, the voltage applied to the semi-selected memory cell 12 can be approximated by a value obtained by dividing the potential difference given by the voltage $V_B$–the voltage $V_{UW}$ or the voltage $V_{UB}$–the voltage $V_W$ by the semi-selected memory cell 12 and the resistance load $Z_1$5.

If the semi-selected memory cell 12 is in the high-resistance state, therefore, the extent of contribution of the semi-selected memory cell 12 of the voltage drop of the voltage $V_B$–the voltage $V_{UW}$ or the voltage $V_{UB}$–the voltage $V_W$ is increased. This corresponds to the downward movement of a connection node N1 with the semi-selected memory cell 12 and the resistance load $Z_1$5 and the upward movement of a connection node N2. The voltage applied to the semi-selected memory cell 12 is increased, and the voltage applied to the unselected memory cell 13 is decreased. As a result, the voltage applied to the unselected memory cell 13 can be decreased while the electric current flowing through the semi-selected memory cell 12 is reduced.

If the semi-selected memory cell 12 is in the low-resistance state, the extent of contribution of the resistance load $Z_1$5 of the voltage drop of the voltage $V_B$–the voltage $V_{UW}$ or the voltage $V_{UB}$–the voltage $V_W$ is increased. This corresponds to the upward movement of the connection node N1 with the semi-selected memory cell 12 and the resistance load $Z_1$5 and the downward movement of the connection node N2. The voltage applied to the semi-selected memory cell 12 is decreased, and the voltage applied to the unselected memory cell 13 is increased. In this case, the voltage applied to the unselected memory cell 13 is hardly decreased, while the increase of the electric current flowing through the semi-selected memory cell 12 can be suppressed.

This effect is automatically caused based on the resistance state of the semi-selected memory cell 12 even if the voltages $V_{UB}$ and $V_{UW}$ of the unselected line are constant. It is thus not necessary to control the voltages $V_{UB}$ and $V_{UW}$ of the unselected line. To exhibit this effect, the magnitude of the resistance value of the resistance load $Z_1$5 should be the magnitude in the range that the resistance value of the cell can take, more desirably, about the same magnitude as the resistance value of the high-resistance state of the cell.

In the case of the configuration shown in FIG. 6, if any one of the (n−1)+(m−1) memory cells in the semi-selected state is in the high-resistance state, the applied voltage of the unselected memory cell 13 connected to the same word line or the same bit line as that of the memory cell in the high-resistance state can be suppressed, making it possible to reduce the power consumption. In the comparative example shown in FIG. 4, in contrast, if only a few memory cells in the semi-selected state are in the low-resistance state, the limit of the power consumption reduction effect is reached.

Figure 7:
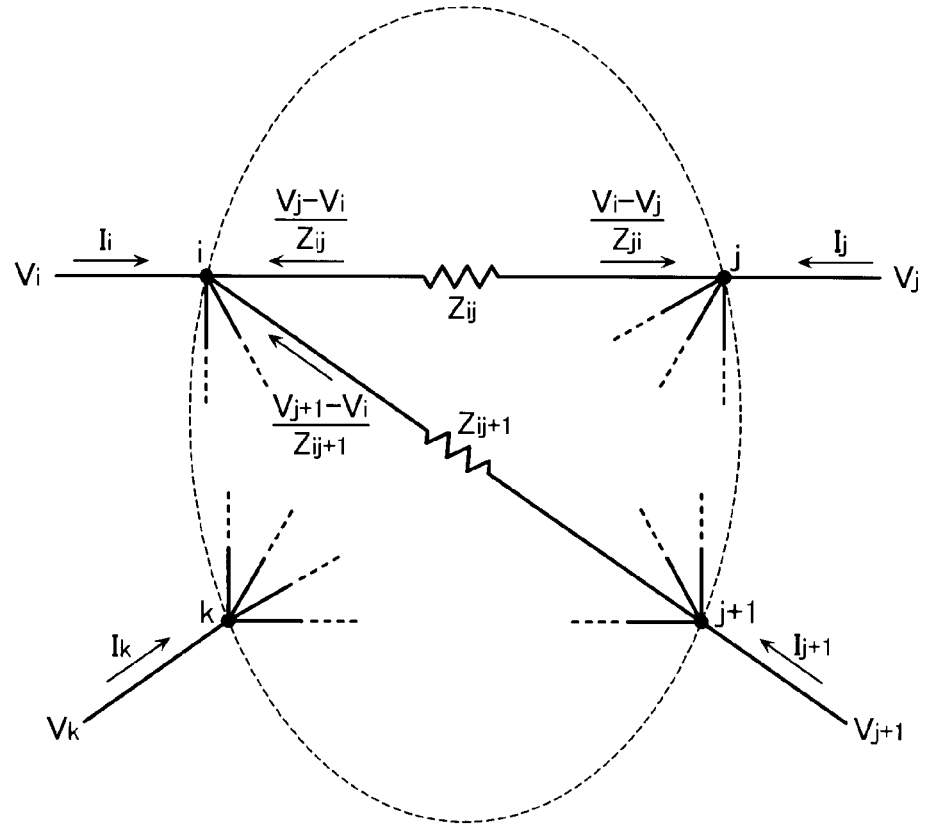
FIG. 7 is a schematic diagram for explaining the memory cell array of the semiconductor memory device according to the embodiment.

Here, the result obtained by analyzing the condition for minimizing the power consumption of the memory cell array will be described. FIG. 7 is a schematic diagram for explaining the memory cell array of the semiconductor memory device according to this embodiment. Each of terminals i, j and k denotes a connection node between the components of an arbitrary circuit. As shown in FIG. 7, the voltage of the terminal is $V_i$, the electric current flowing into the terminal i is $I_i$, and the resistance load between the terminals i and j is $Z_{ij}$. When the electric current flows out from the terminal i, $I_i$ is of negative sign.

In FIG. 7, the region surrounded by the broken line shows the memory cell array of the embodiment and the voltage and the electric current applied to the memory cell array via the word lines and the bit lines are shown. In this state, the electric current flowing from the terminal j into the terminal i is given by the following equation.

$$\frac{V_j - V_i}{Z_{ij}} \quad \text{[Equation 1]}$$

It is apparent that the electric current flowing from the terminal j into the terminal i and the electric current flowing from the terminal i into the terminal j have the same magnitude but the different signs. Therefore, $Z_{ij}=Z_{ji}$ is established. This relation is established even if the non-ohmic element like the diode as well as the resistance load exists. In that case, $Z_{ij}$ should have voltage dependence.

According to the law of electric current conservation, the sum of the electric current flowing into the terminal i and the electric current flowing out from the terminal i should be zero. The following equation is thus established.

$$\sum_j \frac{V_j - V_i}{Z_{ij}} + I_i = 0 \quad \text{[Equation 2]}$$

Here, when the power consumption of the entire system is expressed in the circuit of FIG. 7, the following equation is obtained.

$$P = \frac{1}{2} \sum_i \sum_j \frac{(V_j - V_i)^2}{Z_{ij}}, \quad \text{[Equation 3]}$$

When the sum is taken, the head factor ½ is necessary for preventing the double summing of the resistance loads for calculation of a double value. When this equation is transformed using Equation 2, the following equation can be obtained.

$$P = \frac{1}{2}\sum_i\sum_j\left(\frac{(V_j-V_i)V_j}{Z_{ij}} - \frac{(V_j-V_i)V_i}{Z_{ij}}\right) \quad \text{[Equation 4]}$$

$$= \frac{1}{2}\left(\sum_j\left(\sum_i\frac{V_j-V_i}{Z_{ij}}\right)V_j - \sum_i\left(\sum_j\frac{V_j-V_i}{Z_{ij}}\right)V_i\right)$$

$$= \frac{1}{2}\left(\sum_j I_j V_j - \sum_i(-I_i)V_i\right)$$

$$= \sum_i V_i I_i$$

The result of Equation 4 shows that the power consumption of the arbitrary system can be expressed only by the voltage supplied to the terminal and the electric current flowing into the terminal (that is, flowing out from the terminal).

From this result, if the terminal to which the largest voltage is supplied and its voltage value and the terminal to which the smallest voltage is supplied and its voltage value are given in the arbitrary system, the power consumption in the steady state of the system is found to be the smallest value when the electric current does not flow into or out from all other terminals to which an intermediate voltage is supplied. This is proved as follows.

The reference of the voltage value can be arbitrarily taken. The smallest voltage value is zero, that is, $V_0=0$. The number of terminals k is N. From the fact that "the electric current does not flow into or out from all other terminals to which an intermediate voltage is supplied", $I_k=0$ is established with respect to k=1, 2, . . . , and N−1. The power consumption of this system is thus given by $V_N I_N$ from Equation 4.

Here, if the power consumption of this system is further decreased by adjusting the intermediate voltage, it is necessary to make at least one of $I_k$'s sign negative ($V_k$ is not negative because the smallest voltage is zero). In other words, it is necessary to flow the electric current from any one of the terminals at the intermediate voltage. However, the sum of the electric current flowing into and out from this system needs to be zero. It is thus necessary to flow the same amount of electric current from any other terminal j into this system.

If $V_j > V_k$, the power consumption is increased by the absolute value of $(V_j - V_k)I_k$, in which case the power consumption cannot be reduced. If $V_j \leq V_k$, this situation means that the electric current flows out from the terminal j at a low voltage to the terminal k at a high voltage, which is against natural law. Therefore, the power consumption of the system cannot be reduced from $V_N I_N$.

To strictly prove this mathematically, the partial differential of Equation 4 should be evaluated as follows.

$$\frac{\partial P}{\partial V_k} = \sum_i\left(\delta_{ik} I_i + V_i\frac{\partial I_i}{\partial V_k}\right) \quad \text{[Equation 5]}$$

$$= I_k + \sum_i V_i \frac{\partial}{\partial V_k}\left(\sum_j\frac{V_i-V_j}{Z_{ij}}\right)$$

$$= I_k + \sum_i V_i \sum_j \frac{\delta_{ik}-\delta_{jk}}{Z_{ij}}$$

$$= I_k + \sum_j \frac{V_k}{Z_{kj}} - \sum_i \frac{V_i}{Z_{ik}}$$

$$= I_k + \sum_i \frac{V_k - V_i}{Z_{ki}}$$

$$= I_k + I_k$$

$$= 2I_k$$

As is apparent from this result, to minimize the power consumption by adjusting $V_k$, $I_k=0$ should be established. For $I_k=0$, $V_k$ should be adjusted to the same value as that of the voltage when the terminal k is in the floating state. Therefore, when the terminal to which the largest voltage is supplied and its voltage value and the terminal to which the smallest voltage is supplied and its voltage value are given in the arbitrary circuit system, the power consumption in the steady state of the circuit system is minimum on condition that the voltages of all the other terminals to which an intermediate voltage is supplied have the same value as that of the voltage when the respective terminals are in the floating state.

Returning to FIG. 6, the power consumption will be considered again. The voltages $V_B$ and $V_W$ are voltages necessary for write, erase and read of the selected memory cell 11 and are the largest and smallest voltages of the system. To minimize the power consumption in the steady state of this system, as described above, it is desirable that the voltages $V_{UW}$ and $V_{UB}$ be set to the same value as that of the voltage when the unselected word line and the unselected bit line are brought into the floating state in the case where the operating voltage $V_{OP}$ is applied to the selected word line and the selected bit line.

Therefore, the optimum values of the voltages $V_{UW}$ and $V_{UB}$ are changed depending on the resistance value in the low-resistance state of the cell, the number of the semi-selected memory cells 12 in the low-resistance state, the size of the array (the values of m and n), and the leak current of the non-ohmic element as the selective element, and cannot be determined only by the turn-on voltage of the non-ohmic element. When the non-ohmic element having a large leak current needs to be used to secure the largest value of the forward current of the memory cell with respect to the desired operating point or when the size of the memory cell array is increased to reduce the chip size, the effect of the present invention becomes remarkable.

Another resistance load $Z_2$ 6 inserted into the common portion on the power source side is used for preventing the sudden increase of the power consumption to the shift of the system from the ideal state.

The number of the semi-selected memory cells 12 in the low-resistance state among the factors determining the voltage in the floating state is a quantity changed depending on the memory state of the system, which in any case, copes with difficult optimization. The resistance load $Z_2$ 6 can reduce the value of the electric current flowing through the unselected lines and can prevent the sudden increase of the power consumption of the system.

In order that the resistance load $Z_2$ 6 functions effectively, it is desirable that the resistance component of the resistance load $Z_2$ 6 be significantly larger than the combined resistance component when the semi-selected memory cells 12 in the low-resistance state and resistance loads $Z_1$ 5 connected in series are connected in parallel by the number of (m−1). In an actual memory element, the write bit rate may be reduced to about a fraction to ½ of the rate for encoding. When this rate is x, more desirably, the resistance component of the resistance load $Z_2$ 6 should be significantly larger than the combined resistance component when the semi-selected memory cells 12 and the resistance loads $Z_1$ 5 are connected in parallel by the number of (m−1)/x in place of (m−1). When the resistance load $Z_2$6 is extremely large, the time constant of the system is increased, which lengthens the time necessary for the read and write operations of each bit. It is thus desirable that the product of the wiring capacitance of each of the bit lines or each of the word lines and the sum of the variable resistance element 1 and the resistance loads $Z_1$5 and $Z_2$6 be significantly less than the array drive cycle (the drive cycle of the unselected lines).

Figure 8:
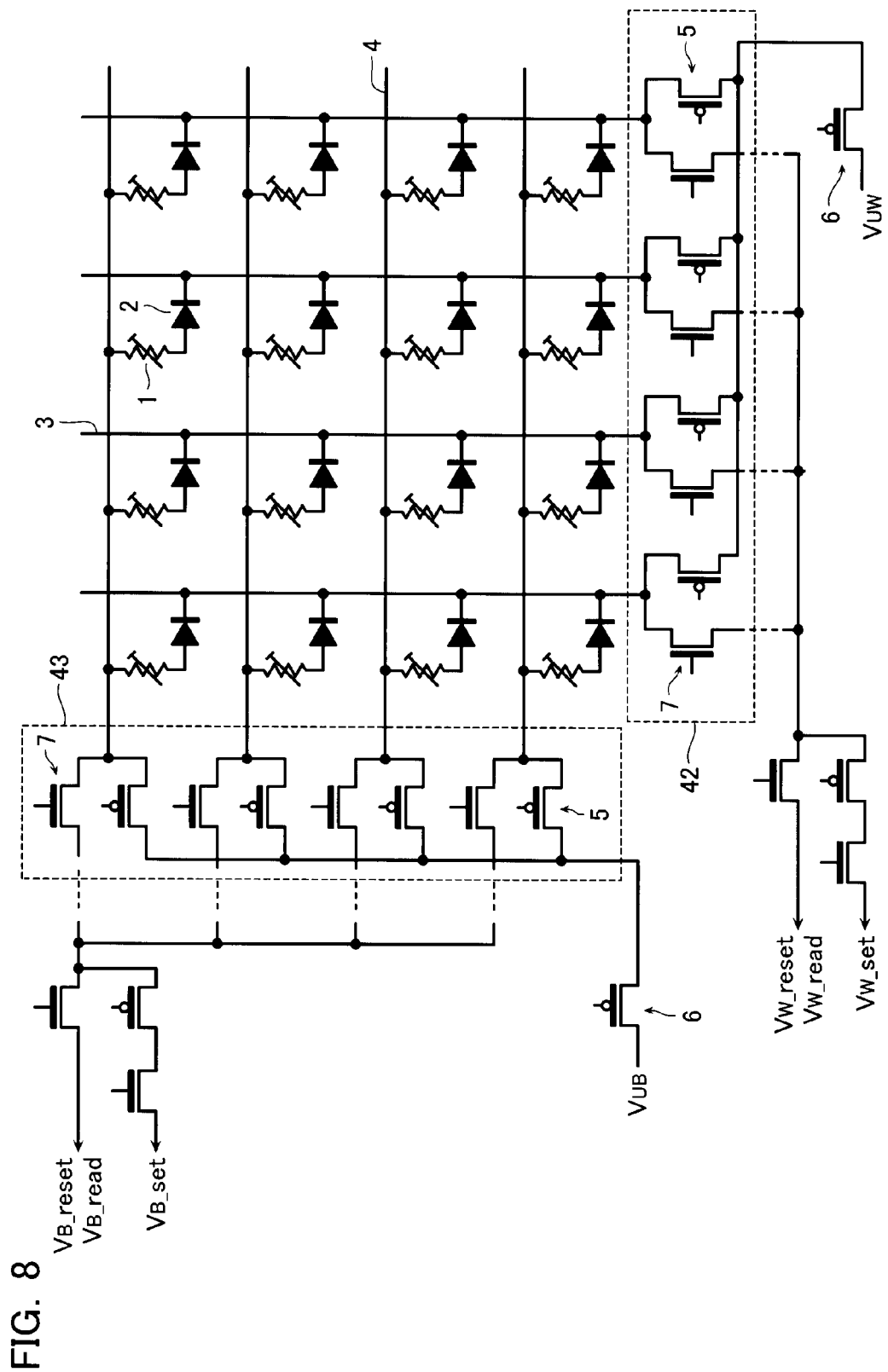
FIG. 8 is a circuit diagram showing part of the semiconductor memory device according to the embodiment.

Here, the resistance load element may be other than a fixed resistor using the wiring layer or the diffusion layer resistance. As shown in FIG. 8, for example, p-type MOSFETs can be used as resistance loads 5 and 6. The impedance of the resistance loads 5 and 6 can be set by controlling the gate voltage of the p-type MOSFETs. In FIG. 8, an n-type MOSFET 7 is a selective transistor controlling whether or not the voltages $V_W$ and $V_B$ necessary for the write, erase and read operations are transferred to the word lines 3 or the bit lines 4. The electric charge charged to the wiring capacitance can be immediately discharged by changing the p-type MOSFETs into the conductive state after write and erase. This is thus advantageous for performing write and erase at a high repetition rate.

Figure 9:
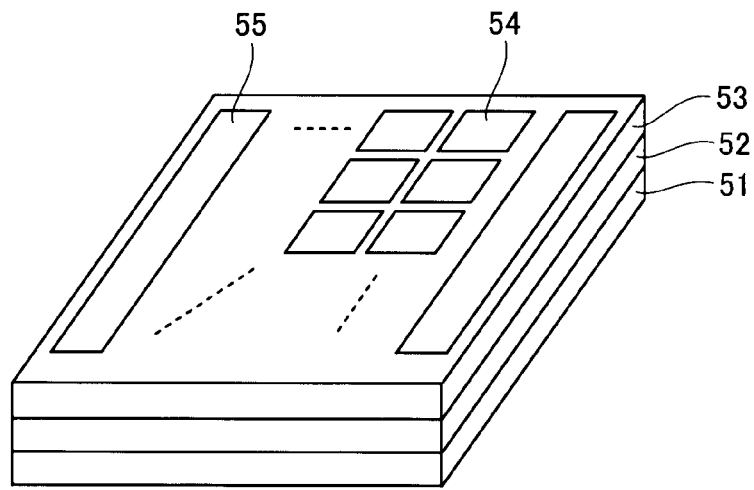
FIG. 9 is a perspective view showing the entire configuration of the semiconductor memory device according to the embodiment.

FIG. 9 is a perspective view showing the entire configuration of the semiconductor memory device according to the present embodiment. There is a general Si substrate 51, on which a CMOS circuit 52 including wiring layer is formed through normally used processes, and a layer 53 containing plural memory cell portions 54 is formed thereon. An individual memory cell portion 54 in FIG. 9 corresponds to the memory cell array 41 in FIG. 1. The CMOS circuit 52 in FIG. 9 includes the portions called peripheral circuits in general semiconductor memory devices, containing the driver, the decoder and the upper block in FIG. 1.

The CMOS circuit 52, except the connections with the memory cell portion 54, is designed and produced under a 90 nm design rule, which is looser than that for the lines in the memory cell portion 54. One memory cell portion 54 occupies an about 44 μm square region and includes 1024×1024 intersections. Blocks having electric connections with the CMOS circuit 52 around the memory cell portions 54 are arranged in matrix on the basis of the memory cell portion 54 and the peripheral connection. Further, through-holes are formed through the layer 53 containing the memory cell portions 54, and I/O portions 55 of the device including terminals having electrical coupling with the I/O portions of the CMOS circuit 52 are formed at the end of the layer 53 containing the memory cell portions 54 as shown in FIG. 9.

With the above-described configuration in the present embodiment, the memory cell portions 54 and the CMOS circuit 52 are coupled in the stacked direction. Therefore, it is possible to achieve a reduction in operating time and a large increase in the number of simultaneously readable/writable memory cells without any increase in chip area. The I/O portions 55 of the device can be bonded to the lead frame in the packaging step, like in general semiconductor devices.

The embodiment of the present invention has been described above. The present invention is not limited to the embodiment and various changes, additions and combinations can be made within the range not departing from the scope of the invention. In the embodiment, $ZnMn_2O_4$ is used as the resistance changing material used for the memory operation, but other materials, such as $NiO$, $TiO_2$, $SrZrO_3$ and $Pr_{0.7}Ca_{0.3}MnO_3$ can be used. Although TiN and TaN are used as the electrode connected to the resistance changing material, other materials, such as Pt, W, WN and Nb-doped $TiO_2$ can be used. Although the PN junction diode of Si is used as the diode, a PN junction diode of an SiGe alloy and a Schottky diode can be used. A tunnel element of MIM structure can also be used.

When the resistance load $Z_1$5 is connected to each of the unselected bit line and the unselected word line, the potentials of each of the unselected lines may be different. In the embodiment, one resistance load $Z_1$5 is provided on each of the unselected lines. In principle, the resistance load $Z_1$5 may be provided behind the plurality of unselected lines are united. In this case, unless the unselected cells in the united block are all in the high-resistance state, the power consumption reduction effect becomes low. Advantageously, however, the occupation area of the resistance loads $Z_1$5 can be reduced.

What is claimed is:

1. A semiconductor memory device comprising:
   a plurality of first wirings arranged in parallel;
   a plurality of second wirings arranged so as to cross the first wirings;
   a plurality of memory cells positioned at respective intersections of the first wirings and the second wirings, each of the memory cells having a variable resistance element and a selective element connected to the variable resistance element in series;
   a first selection portion selecting the first wiring;
   a second selection portion selecting the second wiring; and
   a power source portion applying predetermined selected-wiring-voltages to a selected first wiring being selected by the first selection portion and a selected second wiring being selected by the second selection portion, respectively, and applying predetermined unselected-wiring-voltages to unselected first wirings other than the selected first wiring and unselected second wirings other than the selected second wiring, respectively,
   a resistance element having a predetermined resistance value being provided between the power source portion and the unselected first and second wirings,
   wherein the resistance element includes a plurality of first resistance elements and a plurality of second resistance elements,
   the first resistance elements are provided on the unselected first wirings and the unselected second wirings, respectively,
   the variable resistance element is brought into either of a high-resistance state and a low-resistance state, and
   the resistance value of the first resistance element is substantially the same as that of the variable resistance element in the high-resistance state.

2. The semiconductor memory device according to claim 1, wherein the resistance value of the first resistance element is selected in a possible range of a combined resistance value of the variable resistance element and the selective element.

3. The semiconductor memory device according to claim 1, wherein the second resistance elements are provided between the first selection portion and the power source portion and between the second selection portion and the power source portion.

4. The semiconductor memory device according to claim 3, wherein the resistance value of the second resistance element provided between the first selection portion and the power source portion is larger than a combined resistance value when the memory cells and the first resistance elements connected in series are connected in parallel by the number of the unselected first wirings, and
the resistance value of the second resistance element provided between the second selection portion and the power source portion is larger than a combined resistance value when the memory cells and the first resistance elements connected in series are connected in parallel by the number of the unselected second wirings.

5. The semiconductor memory device according to claim 3, wherein a product of a sum of the resistance values of the variable resistance element, the first resistance element and the second resistance element and the wiring capacitance of each of the unselected first wirings or each of the unselected second wirings is less than a drive cycle time of the unselected first wirings or the unselected second wirings.

6. The semiconductor memory device according to claim 1, wherein the power source portion applies substantially the same value as that of the voltage when the unselected wiring is brought into the floating state to the unselected first wirings and the unselected second wirings in the case where the selected-wiring-voltage is applied to the selected first wiring and the selected second wiring.

7. The semiconductor memory device according to claim 1, wherein the resistance element is a MOSFET.

8. The semiconductor memory device according to claim 1, wherein the power source portion applies a first selected-wiring-voltage to the selected first wiring and a second selected-wiring-voltage to the selected second wiring so as to apply a first potential difference to the selected memory cell positioned at intersections of the selected first wiring and the selected second wiring, and
the power source portion applies a first unselected-wiring-voltage being larger than the first selected-wiring-voltage and being smaller than the second selected-wiring-voltage to the unselected second wiring and applies a second unselected-wiring-voltage being smaller than the second selected-wiring-voltage by the first unselected-wiring-voltage to the unselected first wiring so as to apply a reverse bias of a second potential difference smaller than the first potential difference to the unselected memory cell positioned at intersections of the unselected first wiring and the unselected second wiring.

9. The semiconductor memory device according to claim 8, wherein the voltage value of the first unselected-wiring-voltage is smaller than a turn-on voltage of the selective element.

10. A semiconductor memory device comprising:
a plurality of first wirings arranged in parallel;
a plurality of second wirings arranged so as to cross the first wirings;
a plurality of memory cells positioned at respective intersections of the first wirings and the second wirings, each of the memory cells having a variable resistance element and a selective element connected to the variable resistance element in series;
a first selection portion selecting the first wiring;
a second selection portion selecting the second wiring;
a power source portion applying predetermined selected-wiring-voltages to a selected first wiring being selected by the first selection portion and a selected second wiring being selected by the second selection portion, respectively, and applying predetermined unselected-wiring-voltages to unselected first wirings other than the selected first wiring and unselected second wirings other than the selected second wiring, respectively;
a plurality of first resistance elements provided on each of the first wirings and the second wirings in the first selection portion and the second selection portion and connected to the first wirings and the second wirings in the unselected state, each of the first resistance elements having a predetermined resistance value and having substantially the same resistance value as other first resistance elements; and
a plurality of second resistance elements provided between the power source portion and the first and second selection portions and having a predetermined resistance value.

11. The semiconductor memory device according to claim 10, wherein the resistance value of the first resistance element is selected in a possible range of a combined resistance value of the variable resistance element and the selective element.

12. The semiconductor memory device according to claim 10, wherein the variable resistance element is brought into either of a high-resistance state and a low-resistance state, and
the resistance value of the first resistance element is substantially the same as that of the variable resistance element in the high-resistance state.

13. The semiconductor memory device according to claim 10, wherein the power source portion applies substantially the same value as that of the voltage when the unselected wiring is brought into a floating state to the unselected first wirings and the unselected second wirings in the case where the selected-wiring-voltage is applied to the selected first wiring and the selected second wiring.

14. A semiconductor memory device comprising:
a plurality of first wirings arranged in parallel;
a plurality of second wirings arranged so as to cross the first wirings;
a plurality of memory cells positioned at respective intersections of the first wirings and the second wirings, each of the memory cells having a variable resistance element and a selective element connected to the variable resistance element in series;
a first selection portion selecting the first wiring;
a second selection portion selecting the second wiring;
a power source portion applying predetermined selected-wiring-voltages to a selected first wiring being selected by the first selection portion and a selected second wiring being selected by the second selection portion, respectively;
a plurality of first resistance elements provided on each of the first wirings and the second wirings in the first selection portion and the second selection portion and connected to the first wirings and the second wirings in the unselected state, each of the first resistance elements having a predetermined resistance value and having substantially the same resistance value; and
a plurality of second resistance elements having a predetermined resistance value and provided between the power source portion and the first and second selection portions,
the power source portion applying unselected-wiring-voltages via the first and second resistance elements to the unselected first wirings other than the selected first wiring and the unselected second wirings other than the selected second wiring.

15. The semiconductor memory device according to claim 14, wherein the resistance value of the first resistance element is selected in a possible range of a combined resistance value of the variable resistance element and the selective element.

16. The semiconductor memory device according to claim 14,
wherein the variable resistance element is brought into either of a high-resistance state and a low-resistance state, and
the resistance value of the first resistance element is substantially the same as that of the variable resistance element in the high-resistance state.

17. The semiconductor memory device according to claim 14,
wherein the resistance value of the second resistance element provided between the first selection portion and the power source portion is larger than a combined resistance value when the memory cells and the first resistance elements connected in series are connected in parallel by the number of the unselected first wirings, and
the resistance value of the second resistance element provided between the second selection portion and the power source portion is larger than a combined resistance value when the memory cells and the first resistance elements connected in series are connected in parallel by the number of the unselected second wirings.

18. The semiconductor memory device according to claim 14,
wherein the voltage value of the unselected-wiring-voltage applied to the unselected second wiring is smaller than a turn-on voltage of the selective element.

19. A semiconductor memory device comprising:
a plurality of first wirings arranged in parallel;
a plurality of second wirings arranged so as to cross the first wirings;
a plurality of memory cells positioned at respective intersections of the first wirings and the second wirings, each of the memory cells having a variable resistance element and a selective element connected to the variable resistance element in series;
a first selection portion selecting the first wiring;
a second selection portion selecting the second wiring; and
a power source portion applying predetermined selected-wiring-voltages to a selected first wiring being selected by the first selection portion and a selected second wiring being selected by the second selection portion, respectively, and applying predetermined unselected-wiring-voltages to unselected first wirings other than the selected first wiring and unselected second wirings other than the selected second wiring, respectively,
a resistance element having a predetermined resistance value being provided between the power source portion and the unselected first and second wirings,
wherein the resistance element includes a plurality of first resistance elements and a plurality of second resistance elements,
the first resistance elements are provided on the unselected first wirings and the unselected second wirings, respectively, and
each of the first resistance elements has substantially the same resistance value.

\* \* \* \* \*